United States Patent [19]

Poteat

[11] Patent Number: 4,470,875
[45] Date of Patent: Sep. 11, 1984

[54] FABRICATION OF SILICON DEVICES REQUIRING ANISOTROPIC ETCHING

[75] Inventor: Tommy L. Poteat, Bridgewater, N.J.

[73] Assignee: AT&T Bell Laboratories, Murray Hill, N.J.

[21] Appl. No.: 550,190

[22] Filed: Nov. 9, 1983

[51] Int. Cl.³ .................. H01L 21/306; B44C 1/22; C03C 15/00; C03C 25/06
[52] U.S. Cl. .................................. 156/644; 156/647; 156/657; 156/659.1; 156/662; 252/79.5
[58] Field of Search ............ 156/644, 647, 653, 657, 156/659.1, 661.1, 662; 252/79.1, 79.5

[56] References Cited

U.S. PATENT DOCUMENTS 3,765,969 10/1973 Kragness et al. ..................... 156/17

OTHER PUBLICATIONS

E. Bassous, Fabrication of Novel Three-Dimensional Microstructures by the Anisotropic Etching of (100) and (110) Silicon, *IEEE Transactions on Electron Devices*, vol. ED-25, No. 10, Oct. 1978, pp. 1178-1185.

U.S. Ser. No. 469,410, filed Feb. 24, 1983.

*Primary Examiner*—William A. Powell
*Attorney, Agent, or Firm*—Lester H. Birnbaum

[57] ABSTRACT

A method for micromachining precise semiconductor features involving a pre-etch for establishing proper mask alignment. In one embodiment, the pre-etch utilizes a mask opening which has at least two edges oriented at a significant angle with the nominal (110) direction of a silicon wafer. The silicon is anisotropically etched through this opening until the true (110) lines are revealed by the intersection of the (111) planes with the wafer surface. Two parallel lines will therefore be formed to provide alignment of the mask for subsequent feature definition.

In a further embodiment, the silicon wafer is completely etched through so that a pit edge on the front surface is offset on the back surface by an amount equal to the wafer thickness. This provides front-to-back alignment in subsequent processing.

16 Claims, 8 Drawing Figures

FABRICATION OF SILICON DEVICES REQUIRING ANISOTROPIC ETCHING

BACKGROUND OF THE INVENTION

This invention relates to etching of features in a semiconductor wafer, and in particular to a method of establishing precise mask alignments in the fabrication of such features.

Micromachining of silicon, which involves formation of small features by anisotropic etching of a silicon wafer or substrate, is gaining increasing importance in a number of device areas. Since feature size and shape rely upon the varying etch rates along different crystal planes, alignment of the photolithographic masks used for etching can be quite critical. For example, V-shaped grooves are presently formed in a (100) oriented silicon wafer to provide channels for alignment of optical fibers. (For a general discussion of etching silicon wafers having a (100) surface, see, e.g., U.S. Pat. No. 3,765,969, issued to Kragness et al, and assigned to the present assignee, which is incorporated by reference herein.) In order to provide grooves with the precise width needed for fiber alignment, the etch mask opening must be closely aligned with the (110) direction of the wafer. For some applications, the width error is desirably no greater than 0.25 $\mu$m, which requires that the mask opening edge make an angle of no greater than approximately $5 \times 10^{-3}$ degrees with the (110) direction. While the flat portion of silicon wafers is nominally in the (110) plane, this accuracy is no greater than $\pm 0.5$ degrees.

Consequently, it is an object of the invention to precisely establish the location of crystal planes in a semiconductor wafer and provide a means for aligning photolithographic masks with the appropriate crystal orientations to produce the desired features.

In many micromachining operations, such as the fabrication of silicon microphones and ink jet nozzles, it is necessary to etch the back surface of the silicon wafer to define the desired feature (see, e.g., U.S. patent application of Busch-Vishniac et al, Ser. No. 469,410, filed Feb. 24, 1983, and assigned to the present assignee). This type of fabrication usually requires an alignment of photolithographic masks on the front and back surfaces of the wafers so that the etched feature is properly aligned with elements formed by etching or other processing using photolithographic masks on the front surface. Such an alignment is typically produced by means of holes drilled through the substrate by lasers. While effective, this alignment technique is only as accurate as the mechanical positioning of the table on which the wafer is mounted during drilling. An alignment using photolithographic techniques would be far more accurate.

It is therefore a further object of the invention to provide front-to-back mask alignment in the etching of features in at least one surface of a semiconductor wafer.

SUMMARY OF THE INVENTION

These and other objects are achieved in accordance with the invention which is a method of fabricating semiconductor devices by means of anisotropic etching of at least one major surface of a semiconductor wafer using a photolithographic mask. The invention includes the step of providing an alignment mark for said mask in the wafer. In accordance with one aspect of the invention, a pre-etch mask is provided on the surface of the wafer with an opening having at least two edges at a substantial angle with the approximate crystal orientation desired for the alignment of the photolithographic mask. The surface is then anisotropically etched through the pre-etch mask for a sufficient time to form at least two parallel edges where the etched surfaces intersect the wafer surface at the precise desired crystal orientation.

In accordance with a further aspect of the invention, a pre-etch mask with an opening is formed on one surface of the wafer. The surface is anisotropically etched through the pre-etch mask for a sufficient time to completely etch through to the opposite surface of the wafer. The resulting edges in the hole on both surfaces provide the alignment marks for the photolithographic masks.

BRIEF DESCRIPTION OF THE DRAWING

These and other features of the invention are delineated in detail in the following description. In the drawing.

It will be appreciated that for purposes of illustration, these figures are not necessarily drawn to scale. It will also be appreciated that for purposes of clarity, not all of the etched crystal planes are shown in the figures.

DETAILED DESCRIPTION

Figure 1:
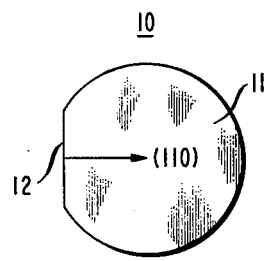
FIG. 1 is a top view of a typical silicon wafer of (100) orientation with an indication of the approximate location of a desired crystal orientation.

FIG. 1 illustrates a typical silicon wafer, 10, which may utilize the present invention. The major surface, 11, lies in the (100) crystallographic plane. Typically, such wafers are fabricated with a flat surface portion 12, lying approximately in the (110) crystallographic plane, thereby establishing the approximate (110) direction, as indicated, perpendicular to the wafer flat. It is desirable in forming V-grooves for fiber alignment to align the photolithographic mask with the (110) direction. However, as indicated previously, the location of the (110) direction based on the wafer flat is not sufficiently accurate to ensure a groove having the appropriate width tolerances.

Figure 2:
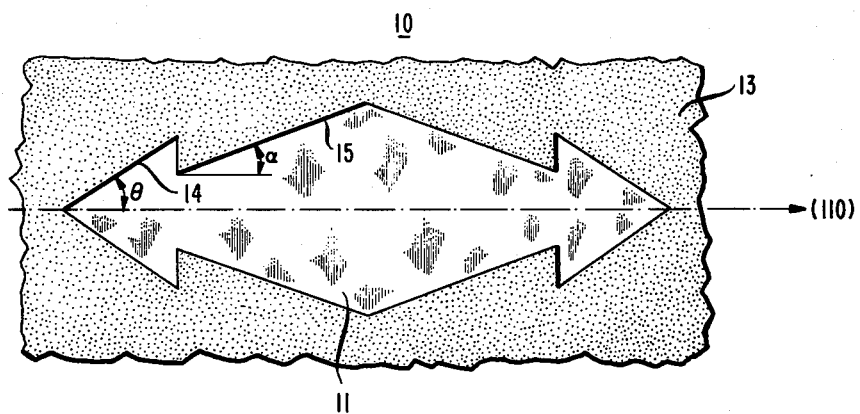
FIG. 2 is a top view of a portion of a pre-etch mask which may be utilized on the surface of the wafer in accordance with one embodiment of the invention.

Thus, in accordance with one aspect of the invention, a pre-etch is performed to determine the precise location of the desired crystallographic direction, in this case the (110) direction. To accomplish this, a pre-etch mask was formed on the surface, 11, of the wafer, with a particular opening as illustrated in the top view of FIG. 2. This opening can be positioned at one or more locations on the surface as desired. The mask, 13, can be formed from standard material such as a layer of silicon dioxide or silicon nitride with a thickness of approximately 1000 Å or more. In this particular example, the mask was silicon dioxide having a thickness of approximately 1 μm. The mask opening can be formed by standard photolithographic techniques.

The opening itself is designed to include at least two edges, such as 14 and 15, which are at a substantial angle, $\theta$ and $\alpha$ respectively, with the nominal (110) direction indicated by the dashed line. In this example, $\theta$ was approximately 30 degrees and $\alpha$ was approximately 20 degrees. The particular opening pattern here is a "double-arrow" configuration, but a "single-arrow" configuration (one-half of the pattern in FIG. 2) or other configurations may be used according to particular needs. The width, w, of the opening in this example was 105 μm and the length was 650 μm.

The silicon surface was then anisotropically etched by a standard material which etches the (100) and (110) planes at a much faster rate than the (111) planes. In this example, the etchant was a mixture of potassium hydroxide (KOH) and water, but other anisotropic etches may be employed.

Figure 3:
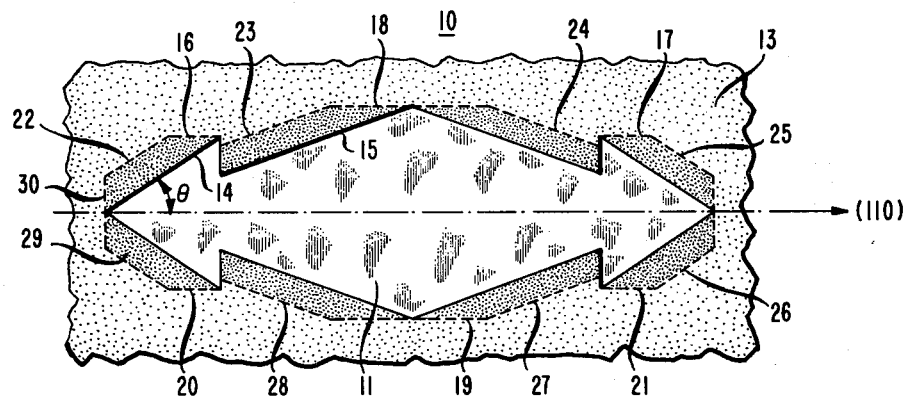
FIG. 3 is a top view of a portion of a pre-etch mask in accordance with the same embodiment, with an indication of etch-pit boundaries which may be utilized in accordance with the invention.
Figure 4:
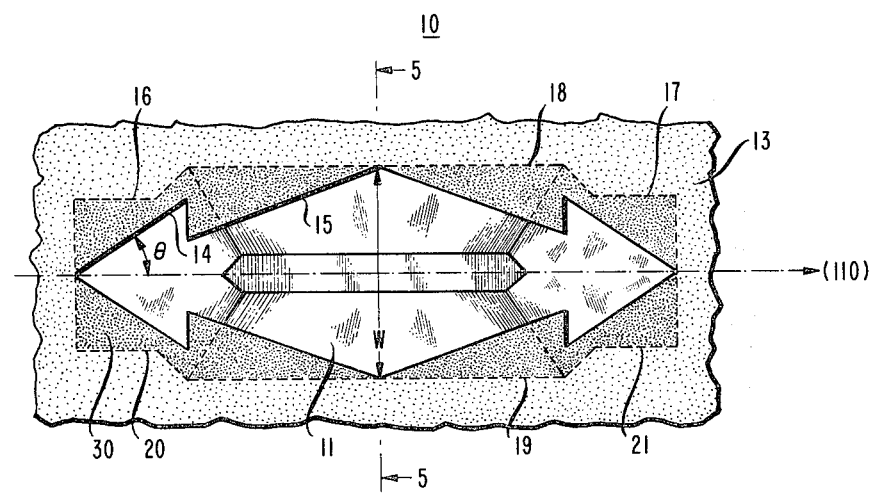
FIG. 4 is a top view of the same pre-etch mask as FIG. 2 and 3 but indicating different etch-pit boundaries.

As a result of the anisotropic nature of the etch, the position of the (111) planes was revealed since etching essentially stops at these planes. Thus, as etching proceeds, the mask opening will be undercut as illustrated by the heavily stippled region, 30, in FIG. 3. It will be noted that edges, 22–29, of the etched pit at this stage follow the edges of the mask opening. However, edges, 16–21, have also been formed independent of the edges of the opening. These edges occur where the (111) planes, which are not etched, intersect the (100) wafer surface and therefore indicate the precise location of the (110) direction for this wafer. At this point, the etch could be stopped, but it is generally preferred to continue the etch until the condition in FIG. 4 is reached. Here, the mask-controlled edges have been eliminated, leaving only the edges, 16–21, indicating the (110) direction of the wafer.

In this particular example, the (110) edges were fully formed after approximately 40 minutes. Of course, other etching times may be employed depending on the type of etchant, the size of the mask opening and the degree of definition of the (110) surfaces desired. In general, etching times will be in the range of 10 minutes to 60 minutes.

The choice of the angles, $\theta$ and $\alpha$, between the mask edges and the nominal (110) direction is an important factor in determining the relative etch rate between the (100) and (111) planes and thus determines the degree of delineation of the (110) directions. If the relative etch rate is too slow, the appearance of the (110) direction may not be easily ascertained. It is recommended, therefore, that the acute angle be in the range 15–75 degrees.

Figure 7:
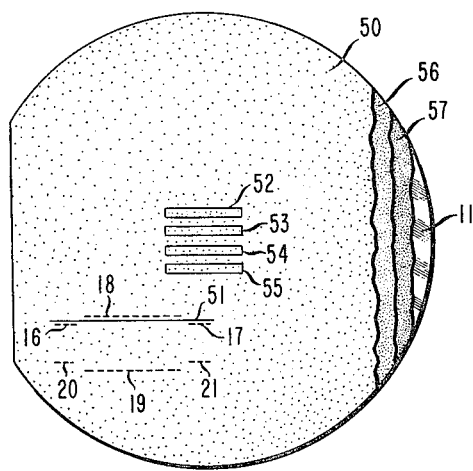
FIG. 7 is an enlarged top view of the wafer illustrated in FIG. 1 with a photolithographic mask aligned in accordance with the first embodiment of the invention.

In subsequent processing, the layer, 13, was removed from the surface and a new oxide grown thereon. A standard photoresist layer was formed over the oxide layer. The appropriate pattern for etching was formed in accordance with standard photolithography by exposing the photoresist layer through a photolithographic mask such as that illustrated as 50 in FIG. 7. (It will be appreciated that only some of the mask features are shown and the features are greatly enlarged for purposes of illustration.) In accordance with the invention, however, this mask was aligned with the (110) direction by placing the standard alignment or reference line, 51, on the mask in parallel with the edges, 16, 17, 18, or 19, 20, 21. The advantage of having at least two edges, 14 and 15, for the pre-etch mask opening is that at least two parallel edges, 16 and 18, will be formed in the silicon. The subsequent mask alignment can be made by placing the alignment mark on the mask between the two edges, 16 and 18, and, consequently, visual, parallel alignment is greatly simplified for the operator.

Figure 8:
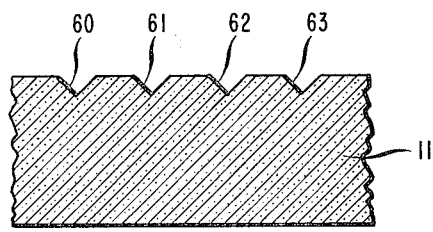
FIG. 8 is a cross-sectional view of a portion of said wafer at a later stage of fabrication.

In this example, the mask, 50, had a series of rectangular openings such as 52–55 having dimensions of 105 μm × 1.24 cm which were utilized to open windows in the underlying photoresist layer, 56, which in turn formed the etch mask openings in the underlying oxide, 57, to fabricate V-grooves in the wafer. Some of the resulting V-grooves are illustrated as features 60–63 in the cross-sectional view of wafer, 11, shown in FIG. 8. Each V-groove is of a size adapted to receive an optical fiber to provide alignment of each fiber with an optical component. The width of the V-grooves varied no more than ±0.5 μm among several dozen grooves on two wafers. This indicates that the alignment error of the rectangular masks was no more than $4.6 \times 10^{-3}$ degrees from the true (110) direction as determined by the present method. Thus, the pre-etch method determines the precise crystallographic orientation and permits an essentially exact alignment therewith.

Figure 5:
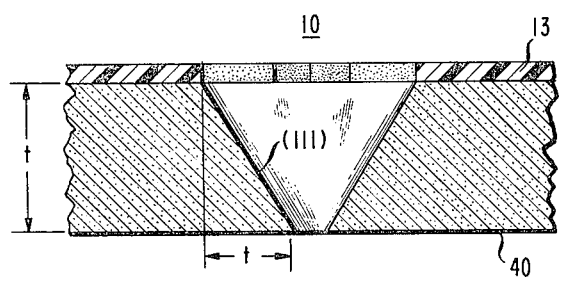
FIG. 5 is a cross-sectional view along line 5—5 of FIG. 4 illustrating the geometry of an etch pit in accordance with a further embodiment of the invention.
Figure 6:
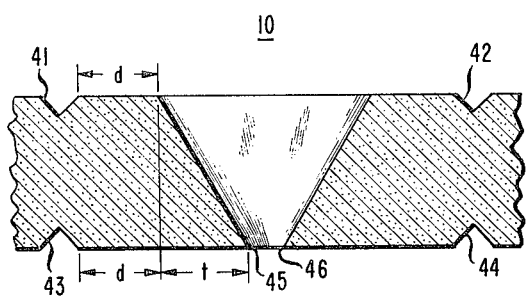
FIG. 6 is a cross-sectional view of the same wafer as shown in FIG. 5 at a later stage of fabrication.

In accordance with another aspect of the invention, a pre-etch may also be performed to provide alignment for features on the front and back surfaces. The same mask opening of FIGS. 2–4 may be used for this alignment, but in this example the mask, 13, was silicon nitride with a thickness of approximately 1000 Å. An additional requirement for the opening in this aspect is that it will have a width (w of FIG. 4) which is sufficient so that the wafer is completely etched through. FIG. 5 is a cross-sectional view along line 5—5 of FIG. 4 in the case where the wafer is etched through. Since anisotropic etching produces a V-groove in the plane shown in FIG. 5 with sides constituting the (111) planes, the edge of any hole etched in the opposite surface (40) will be offset from the edge of the hole in the front surface (11) precisely by a distance t which is also the thickness of the wafer. Since the thickness of the wafer can be measured and controlled very accurately, a feature on the front surface can be aligned with a feature on the back surface. Thus, for example, as shown in FIG. 6, grooves, 41 and 42, or other features were etched in the front surface, subsequent to the pre-etch shown in FIG. 5, by using a photolithographic mask with the groove patterns a distance, d, from reference lines which were aligned with the edges, 18 and 19, formed during the pre-etch. The photolithographic mask used on the opposite surface for forming grooves, 43 and 44, had groove patterns spaced a distance, d+t, from reference marks which were aligned with edges, 45 and 46, formed on that surface during the pre-etch. The grooves, 43 and 44, were thereby aligned with corresponding grooves, 41 and 42.

In this example, the pre-etch was performed with a mask opening having a width of 900μ and a KOH etchant was applied for approximately 500 minutes to completely etch through the wafer, which had a thickness of approximately 21 mils. It will be appreciated that the width w can be varied to produce holes in the opposite surface of varying widths since the relationship between the edges of the holes in front and back surfaces will always be offset by the same amount (t). Further, although use of the particular mask opening shown is advantageous for alignment, other openings with the proper width, including a rectangular opening, could be employed in this aspect of the invention.

It will be appreciated that, although the invention has been described with reference to etching a (100) oriented silicon wafer, it may be used on other semiconductor wafers or on silicon wafers having different crystallographic orientations.

Various additional modifications will become apparent to those skilled in the art. All such variations which basically rely on the teachings through which the invention has advanced the art are properly considered within the spirit and scope of the invention.

What is claimed is:

1. A method of fabricating semiconductor devices by means of anisotropic etching of at least one major surface of a semiconductor wafer using a photolithographic mask including the step of providing an alignment mark for said mask in the wafer comprising the steps of:
    forming a pre-etch mask on the surface of the wafer with an opening having at least two edges at a substantial angle with the approximate crystal orientation desired for the alignment of the photolithographic mask; and
    anisotropically etching the surface through the pre-etch mask for a sufficient time to form at least two essentially parallel edges in the wafer where the etched surfaces intersect the wafer surface at the precise desired crystal orientation.

2. The method according to claim 1 wherein the semiconductor is silicon, the surface of the wafer lies in the (100) crystallographic plane and the desired crystallographic orientation is the (110) direction.

3. The method according to claim 1 wherein the angle of the pre-etch mask edges with the desired orientation lies within the range 15-75 degrees.

4. The method according to claim 1 wherein the opening in the pre-etch mask comprises an arrow configuration.

5. The method according to claim 1 further comprising the step of aligning the photolithographic mask by placing a reference line on the mask between and parallel with the parallel edges formed during the pre-etch.

6. The method according to claim 5 further comprising the step of etching V-grooves in the surface of the wafer utilizing a pattern in an etch mask formed from said photolithographic mask, each groove being adapted to receive therein an optical fiber.

7. The method according to claim 1 wherein the wafer is completely etched through to the opposite surface to form a hole with an edge which is offset from an edge in the hole on the front surface by an amount equal to the thickness of the substrate to permit alignment of features on the front and back surfaces.

8. The method according to claim 1 wherein the opening in the pre-etch mask comprises a double-arrow configuration so that etching forms at least two edges which are essentially colinear and at least a third edge which is essentially parallel thereto.

9. A method of fabricating silicon devices by means of anisotropic etching a wafer utilizing a photolithographic mask on at least one major surface of the wafer which lies in the (100) crystallographic plane comprising the steps of:
    forming a pre-etch mask on the surface of the wafer with an opening comprising a double-arrow configuration having its major edges forming an acute angle with the approximate (110) crystallographic direction in the range 15-75 degrees;
    anisotropically etching the surface through the pre-etch mask for a sufficient time to form at least first and second colinear edges and a third edge displaced from the other two and parallel therewith where the etched surfaces intersect the wafer surface at the precise (110) direction of the substrate; and
    aligning the photolithographic mask by placing an alignment mark on the mask parallel with and in the space between the first, second and third edges.

10. A method of fabricating semiconductor devices by means of anisotropic etching of at least one major surface of the semiconductor wafer and forming elements on the opposite surface utilizing photolithographic masks including the step of providing an alignment mark for said masks on both surfaces of the wafer comprising the steps of:
    forming a pre-etch mask with an opening on one surface of the wafer;
    anisotropically etching the surface through the pre-etch mask for a sufficient time to completely etch through to the opposite surface of the substrate, the resulting edges of the hole in the surfaces providing the alignment marks for the photolithographic masks.

11. The method according to claim 10 wherein the semiconductor is silicon having its major surfaces lying in the (100) crystallographic planes and the edges in the opposite surface are offset from the edges in the one surface by an amount equal to the thickness of the wafer.

12. The method according to claim 10 further comprising the step of aligning reference marks on the photolithographic masks on both surfaces with the edges of the hole formed during the pre-etch.

13. The method according to claim 9 wherein the opening in the pre-etch mask comprises at least two parallel edges at a substantial angle with the approximate crystal orientation desired for alignment of the photolithographic masks.

14. The method according to claim 9 wherein the opening in the pre-etch mask comprises an arrow configuration oriented so that the edges of the holes in each surface comprise at least two parallel edges.

15. The method according to claim 14 wherein the photolithographic masks on both surfaces are aligned by placing a reference line on each mask between and parallel with the two edges on that surface.

16. A method of fabricating silicon devices from a wafer by means of anisotropic etching utilizing photolithographic masks on both major surfaces of the wafer which lie in the (100) crystallographic plane comprising the steps of:
    forming a pre-etch mask on one surface of the wafer with an opening comprising a double-arrow configuration having its major edges forming an acute angle with the approximate (110) crystallographic direction in the range 15-75 degrees;
    anisotropically etching the surface through the pre-etch mask for a sufficient time to completely etch through the wafer to form a hole with at least first and second edges which are colinear and a third edge displaced from the other two and parallel therewith at both major surfaces where the etched surfaces intersect the wafer surfaces at the precise (110) direction of the wafer, at least one edge on the opposite surface being offset from an edge on the one surface by a distance equal to the thickness of the wafer; and aligning the photolithographic masks on both surfaces by placing an alignment mark on each mask parallel with and in the space between the first, second and third edges on their respective surface.

* * * * *